(12) United States Patent
Schoeneborn et al.

(10) Patent No.: US 11,052,610 B2
(45) Date of Patent: Jul. 6, 2021

(54) POWDER DELIVERY DEVICE AND POWDER DELIVERY METHOD FOR PROVIDING RAW MATERIAL POWDER TO A POWDER APPLICATION DEVICE OF A POWDER BED FUSION APPARATUS

(71) Applicant: SLM Solutions Group AG, Luebeck (DE)

(72) Inventors: Henner Schoeneborn, Luebeck (DE); Lukas Roesgen, Luebeck (DE)

(73) Assignee: SLM Solutions Group AG, Lubeck (DE)

( * ) Notice: Subject to any disclaimer, the term of this patent is extended or adjusted under 35 U.S.C. 154(b) by 284 days.

(21) Appl. No.: 16/273,833

(22) Filed: Feb. 12, 2019

(65) Prior Publication Data
US 2019/0176404 A1 Jun. 13, 2019

Related U.S. Application Data

(63) Continuation of application No. PCT/EP2017/069694, filed on Aug. 3, 2017.

(30) Foreign Application Priority Data

Aug. 12, 2016 (EP) .................................... 16183939

(51) Int. Cl.
*B29C 64/393* (2017.01)
*B29C 64/153* (2017.01)
(Continued)

(52) U.S. Cl.
CPC ............ *B29C 64/393* (2017.08); *B22F 10/20* (2021.01); *B29C 64/153* (2017.08);
(Continued)

(58) Field of Classification Search
CPC combination set(s) only.
See application file for complete search history.

(56) References Cited

U.S. PATENT DOCUMENTS

| 5,454,271 A | 10/1995 | Yamamoto et al. |
| 9,327,450 B2 | 5/2016 | Hein et al. |
| (Continued) | | |

FOREIGN PATENT DOCUMENTS

| CN | 101553355 | 10/2009 |
| CN | 102164735 | 8/2011 |
| (Continued) | | |

OTHER PUBLICATIONS

Japanese Examination Report, Japanese Appln. No. 2019-507160, 2 pgs., dated Apr. 3, 2020.
(Continued)

*Primary Examiner* — Kidest Bahta
(74) *Attorney, Agent, or Firm* — Taft Stettinius & Hollister LLP

(57) ABSTRACT

A powder delivery device for providing raw material powder to a powder application device of a powder bed fusion apparatus is provided. The powder delivery device comprises a powder supply section configured to receive raw material powder, the powder supply section comprising an outlet for providing the raw material powder to the powder application device. The powder delivery device further comprises a first physical parameter determining unit arranged at a first location of the powder supply section and configured to determine a first physical parameter in the powder supply section, and a controller configured to determine whether the first physical parameter meets a first tolerance criterion, and a powder treatment unit. The controller is configured to instruct the powder treatment unit to perform a powder treatment in case it determines that the
(Continued)

first physical parameter does not meet the first tolerance criterion.

9 Claims, 4 Drawing Sheets

(51) Int. Cl.
  *B29C 64/35* (2017.01)
  *B29C 64/329* (2017.01)
  *B29C 64/386* (2017.01)
  *B29C 64/314* (2017.01)
  *G06F 30/00* (2020.01)
  *B22F 10/20* (2021.01)
  *B29C 64/255* (2017.01)
  *B33Y 30/00* (2015.01)
  *B33Y 50/02* (2015.01)
  *B22F 10/30* (2021.01)
  *B33Y 10/00* (2015.01)

(52) U.S. Cl.
  CPC .......... *B29C 64/255* (2017.08); *B29C 64/314* (2017.08); *B29C 64/329* (2017.08); *B29C 64/35* (2017.08); *B29C 64/386* (2017.08); *G06F 30/00* (2020.01); *B22F 10/30* (2021.01); *B22F 2999/00* (2013.01); *B33Y 10/00* (2014.12); *B33Y 30/00* (2014.12); *B33Y 50/02* (2014.12); *Y02P 10/20* (2015.11); *Y02P 10/25* (2015.11)

(56) References Cited

U.S. PATENT DOCUMENTS

| | | | |
|---|---|---|---|
| 9,834,391 B2 | 12/2017 | Mauchle et al. | |
| 2009/0206522 A1 | 8/2009 | Hein et al. | |
| 2010/0192806 A1 | 8/2010 | Heugel et al. | |
| 2014/0263209 A1 | 9/2014 | Burris et al. | |
| 2014/0265046 A1 | 9/2014 | Burris et al. | |
| 2015/0336330 A1 | 11/2015 | Herzog | |
| 2016/0059310 A1* | 3/2016 | Junker | B28B 17/04 419/53 |
| 2016/0193696 A1 | 7/2016 | McFarland et al. | |
| 2016/0279705 A1* | 9/2016 | Mironets | B33Y 30/00 |
| 2017/0341146 A1* | 11/2017 | Jamshidinia | B33Y 70/00 |

FOREIGN PATENT DOCUMENTS

| | | |
|---|---|---|
| CN | 105188993 | 12/2015 |
| CN | 105324180 | 2/2016 |
| CN | 105618740 | 6/2016 |
| CN | 105658356 | 6/2016 |
| EP | 3023227 A1 | 11/2014 |
| EP | 3112134 A1 | 1/2017 |
| JP | 0735591 | 2/1995 |
| JP | 2010509092 A | 3/2010 |
| JP | 2016522312 A | 7/2016 |
| WO | 95/34468 A1 | 12/1995 |
| WO | 2015/025171 A2 | 2/2015 |
| WO | 2015151865 A1 | 10/2015 |

OTHER PUBLICATIONS

Chinese Office Action, Chinese Appln. No. 201780049359.X, 7 pgs., dated Sep. 3, 2020.

European Patent Office, International Search Report & Written Opinion issued in corresponding Application No. PCT/EP2017/069694, dated Nov. 6, 2017, 14 pp.

European Patent Office, Extended Search Report issued in corresponding Application No. 16183939.4, dated Feb. 13, 2017, 9 pp.

* cited by examiner

POWDER DELIVERY DEVICE AND POWDER DELIVERY METHOD FOR PROVIDING RAW MATERIAL POWDER TO A POWDER APPLICATION DEVICE OF A POWDER BED FUSION APPARATUS

The present invention relates to a powder delivery device and a powder delivery method for providing raw material powder to a powder application device of a powder bed fusion apparatus.

Powder bed fusion is an additive layering process by which pulverulent, in particular metallic and/or ceramic raw materials can be processed to three-dimensional work pieces of complex shapes. To that end, a raw material powder layer is applied onto a carrier and subjected to radiation (e.g., laser or particle radiation) in a site-selective manner in dependence on the desired geometry of the work piece that is to be produced. The radiation penetrating into the powder layer causes heating and consequently melting or sintering of the raw material powder particles. Further raw material powder layers are then applied successively to the layer on the carrier that has already been subjected to radiation treatment, until the work piece has the desired shape and size. Powder bed fusion may be employed for the production of prototypes, tools, replacement parts, high value components or medical prostheses, such as, for example, dental or orthopedic prostheses, on the basis of CAD data. Examples for powder bed fusion techniques include Selective Laser Melting (SLM) and Selective Laser Sintering (SLS).

Powder bed fusion apparatuses usually comprise a powder application device (e.g. a blade, a roller, or a brush) for applying the layers of raw material powder onto the carrier. The new raw material powder is delivered to the powder application device from a powder repository, which may be located within or outside of the powder bed fusion apparatus. Further, closed powder cycles can be used, wherein unused raw material powder is collected, optionally processed (e.g., cleaned), and re-fed to the powder application device.

In order to obtain a high-quality work piece, it is necessary that the raw material powder (i.e., the powder before being solidified) meets certain quality requirements. More generally, in order to obtain stable and desired process conditions, it is necessary that the physical properties of the raw material powder, which is delivered to the powder application device, and/or the physical properties within a powder supply section, from which the raw material powder is provided to the powder application device, meets certain quality requirements. Examples for such physical properties include but are not limited to an oxygen content, a humidity, a particle size of powder particles, etc.

In known powder bed fusion apparatuses, an operator needs, to check the quality of the raw material powder before it is filled into the powder repository (or before a replaceable powder repository is installed), which is burdensome for the operator. Further, the operator has no influence on a change of the physical properties after the powder has been filled into the repository (or after a replaceable powder repository is installed), i.e., due to environmental influences (e.g., humidity, temperature, etc.). Therefore, it can happen that the physical properties of the raw material powder deteriorate without being noticed. For example, a corrosion state (e.g., an oxidation state) of the powder may change or the humidity (i.e., an $H_2O$ content) may change after the powder has been introduced into the powder repository and/or into the powder cycle of the powder bed fusion apparatus. In that case, it cannot be guaranteed that the quality of the final produced work piece meets a pre-defined quality standard, e.g., with regard to robustness, density, etc.

The invention is directed at the object of providing an apparatus and a method, which solve the above-described problem and/or other related problems. This object is addressed by a powder delivery device and by a powder delivery method according to the claims.

According to a first aspect, a powder delivery device for providing raw material powder to a powder application device of a powder bed fusion apparatus is provided. The powder delivery device comprises a powder supply section configured to receive raw material powder, the powder supply section comprising an outlet for providing the raw material powder to the powder application device. The powder delivery device further comprises a first physical parameter determining unit arranged at a first location of the powder supply section and configured to determine a first physical parameter in the powder supply section, a controller configured to determine whether the first physical parameter meets a first tolerance criterion, and a powder treatment unit, wherein the controller is configured to instruct the powder treatment unit to perform a powder treatment in case it determines that the first physical parameter does not meet the first tolerance criterion.

The first aspect is directed to a powder delivery device. Although the first aspect refers to a powder bed fusion apparatus and to a powder application device of said powder bed fusion apparatus, the powder bed fusion apparatus and the powder application device are not necessarily part of the first aspect. However, the powder delivery device of the first aspect may be arranged within the powder bed fusion apparatus, i.e., be comprised by the powder bed fusion apparatus.

The expressions "raw material powder" and "powder" are used synonymously in this disclosure. Both expressions refer to the raw material powder before being solidified, e.g., by a laser.

The powder supply section may be configured to receive raw material powder from a powder repository. Alternatively, the powder supply section may comprise the powder repository. The powder supply section may be substantially box-shaped, cylindrically shaped, sphere-shaped, or may have any other suitable shape. The powder supply section may comprise a container for raw material powder or it may be a section of a powder line. The section of the powder line may be a section of a powder line, through which the powder falls or is conveyed on its way to the powder application device. The powder line may be part of a closed powder cycle or a powder line connecting a powder repository with the powder application device.

The raw material powder may be fed into the powder supply section via pressure, via an air- or gas-stream, via mechanical forces, and/or via gravitational forces. Similarly, the raw material powder may be provided to the powder application device through the outlet of the powder supply section via pressure, via an air- or gas-stream, via mechanical forces, and/or via gravitational forces.

The first location of the powder supply section may correspond to a location at a wall section of the powder supply section. The first physical parameter may be measured by the first physical parameter determining unit. The first physical parameter may relate to a physical property. The physical property may correspond to a physical property of the raw material powder itself (e.g., particle size, corrosion state, oxidation state, humidity, etc.) or to a physical property of the direct environment of the raw material powder (e.g., oxygen content, pressure, etc.). The first physical parameter may be expressed by a value (e.g., a mean particle diameter value, a humidity percentage value, etc.). The first physical parameter may be stored in a log file of a corresponding building job.

The first location of the powder supply section may be located as close as possible to the outlet. However, the first location may be located upstream enough in the powder supply section, in order to enable a second measurement at a second location and/or to enable powder treatment of the raw material powder after being measured by the first physical parameter determining unit and before leaving the outlet to the powder application device.

The control unit may be a control unit of the powder bed fusion apparatuses or a separate control unit. The control unit may comprise a processor and a memory. The first tolerance criterion may be directed to determining whether the first physical parameter is within a predefined value range. The first tolerance criterion may be directed to determining whether the first physical parameter is above a predefined threshold value. Further, the first tolerance criterion may be directed to determining whether the first physical parameter is below a predefined threshold value.

The powder treatment unit may be configured to carry out a powder treatment in order to change at least one physical property of the raw material powder and/or of the direct environment of the raw material powder. The physical property of the raw material powder may be changed by the powder treatment unit such that, after the powder treatment, the first physical parameter meets the first tolerance criterion or a value of the first physical parameter is at least closer to a threshold value or a value range of the first tolerance criterion than before the powder treatment.

The powder delivery device may further comprise a second physical parameter determining unit arranged at a second position of the powder supply section and configured to determine a second physical parameter in the powder supply section, wherein the control unit is configured to determine whether the second physical parameter meets a second tolerance criterion.

The second position of the powder supply section may correspond to a position as close as possible to the outlet. In this way, the measurement of the second physical parameter may correspond to a final check of the physical properties of the powder. The second physical parameter may relate to a different physical property than the first physical parameter. Just as an example, the first physical parameter may relate to a measured oxygen content, while the second physical parameter may relate to a measured humidity of the raw material powder.

The second physical parameter may relate to the same physical property as the first physical parameter. The second physical parameter may be stored in a log file of a corresponding building job.

In that case, the second tolerance criterion may correspond to the first tolerance criterion. For example, the first tolerance criterion may define that a value measured as the first physical parameter lies within a predefined value range and the second tolerance criterion may define that a value measured as the second physical parameter lies within the same predefined value range. Alternatively, the second tolerance criterion may be different (e.g., stricter) than the first tolerance criterion.

The second position of the second physical parameter determining unit may be located downstream of the first position of the first physical parameter determining unit.

According to this disclosure, the expression "downstream" refers to a flow direction and/or a delivery direction of the raw material powder through the powder supply section. Thus, the expression "downstream" does not necessarily refer to "up" and "down" directions within the powder bed fusion apparatus, e.g., in case the powder is delivered "upwards". The second position of the second physical parameter determining unit may be located closer to the powder application device than the first position of the first physical parameter determining unit.

The powder delivery device may further comprise a valve located at the outlet of the powder supply section.

The valve may be controlled by the control unit. The valve may be configured to close the outlet of the powder supply section in a closed state and to open the outlet of the powder supply section in an opened state.

The control unit may be configured to close the valve in case it determines that the second physical parameter does not meet the second tolerance criterion.

Further, the control unit may be configured to stop a building process of a three-dimensional work piece of the powder bed fusion apparatus in case it determines that the second physical parameter does not meet the second tolerance criterion.

The control unit may be configured to instruct the powder treatment unit to perform a powder treatment in case it determines that the second physical parameter does not meet the second tolerance criterion.

The first physical parameter determining unit may comprise at least one of an oxygen measurement unit, a humidity measurement unit, a flow property measurement unit, a corrosion state measurement unit, an oxidation state measurement unit, a pressure measurement unit, a powder particle size measurement unit, a powder particle form measurement unit, a powder particle distribution measurement unit, a powder purity measurement unit, a powder particle porosity measurement unit, a powder particle density measurement unit, and a pack density measurement unit.

The first physical parameter determining unit may be configured to output a measured value to the control unit. According to this disclosure, outputting or transmitting a measured value or a physical parameter to the control unit may comprise transmitting a digital signal, applying a voltage depending on the measured value, applying a resistance depending on the measured value, applying a capacitance depending on the measured value and/or causing a current flow, the current depending on the measured value. The oxygen measurement unit may comprise an oxygen sensor and/or may be configured to output an oxygen percentage value. The humidity measurement unit may comprise, a humidity sensor (e.g., a $H_2O$ sensor) and/or may be configured to output a humidity percentage value. The flow property measurement unit may comprise an optical unit for performing optical flow property measurements on the raw material powder. For example, the flow property measurement unit may output a flowability value. The corrosion state measurement unit may comprise an optical unit for performing optical corrosion state measurements, such as spectrographic measurements, on the raw material powder. The corrosion state measurement unit may be configured to determine a color and/or a color change of the raw material powder. The corrosion state may correspond to an oxidation state of the raw material powder. The pressure measurement unit may comprise a pressure sensor for outputting a pressure value of a pressure within the powder supply section. The powder particle size measurement unit may be configured to output a minimum particle size value, a maximum particle size value, and/or a mean particle size value of powder particles of the raw material powder. The pack density measurement unit may be configured to determine a pack density of the raw material powder.

The details regarding the first physical parameter determining unit described above may also apply accordingly to the second physical parameter determining unit.

The first physical parameter determining unit may comprise at least one of a sampling point and a sensor.

The sampling point may comprise a location of the powder supply section, where a sample of raw material powder is extracted from a powder flow within the powder supply section or from powder contained in the powder supply section. After being extracted, the sample may be measured by means of a measuring device (e.g., a sensor) and/or by a human. For example, a sample of raw material powder may be extracted and optically analyzed for a particle size, particle form, etc. A result of the analysis may be provided to the controller. The sensor may be a sensor directly arranged at a powder flow within the powder supply section or at powder contained in the powder supply section. The details regarding the first physical parameter determining unit described above may also apply to the second physical parameter determining unit.

The powder treatment unit may comprise at least one of a gas introduction unit, a powder loosening unit, a heating unit, a drying unit, and a vacuum generation unit.

The gas introduction unit may be configured to introduce an inert gas (e.g., argon) into the powder supply section. The powder loosening unit may be configured to loosen the raw material powder and/or to prevent agglutination of the powder. The heating unit may comprise a heating arranged at a wall section between the first position and second position. The drying unit may comprise a heating and/or humidity absorbing means. The vacuum generation unit may be configured to generate a vacuum in the powder supply section. In other words, the vacuum generation unit may be configured to evacuate the powder supply section. For this purpose, the powder supply section may comprise an entry valve and an exit valve that are closed while the powder supply section is evacuated. The powder supply section may be evacuated while at least one of the other powder treatment units is active (e.g., the drying unit and/or the loosening unit). Further, the vacuum generation unit may be activated independently from the other powder treatment units and may serve as an alternative drying unit and/or an alternative loosening unit.

According to a second aspect, a powder bed fusion apparatus is provided. The powder bed fusion apparatus comprises a powder delivery device of the first aspect and the powder application device.

According to the second aspect, the control unit may be configured to stop a powder application process of the powder application device in case it determines that the second physical parameter does not meet the second tolerance criterion. In that case, also a (visual or acoustic) warning signal may be output.

According to a third aspect, a powder delivery method for providing raw material powder to a powder application device of a powder bed fusion apparatus is provided. The powder delivery method comprises providing raw material powder to the powder application device, from an outlet of a powder supply section, and determining a first physical parameter in the powder supply section at a first location of the powder supply section. The powder delivery method further comprises determining whether the first physical parameter meets a first tolerance criterion and performing a powder treatment in case it is determined that the first physical parameter does not meet the first tolerance criterion.

The powder delivery method may further comprise determining a second physical parameter in the powder supply section at a second location of the powder supply section and determining whether the second physical parameter meets a second tolerance criterion.

The second physical parameter may relate to the same physical property as the first physical parameter.

Where applicable, the details described, above with regard to the first and second aspect also apply to the third aspect directed to a powder delivery method.

Preferred embodiments of the invention now are described in greater detail with reference to the appended schematic drawings, wherein FIG. 1 shows a schematic side view of a powder bed fusion apparatus comprising a powder delivery device according to the present disclosure;

Figure 1:
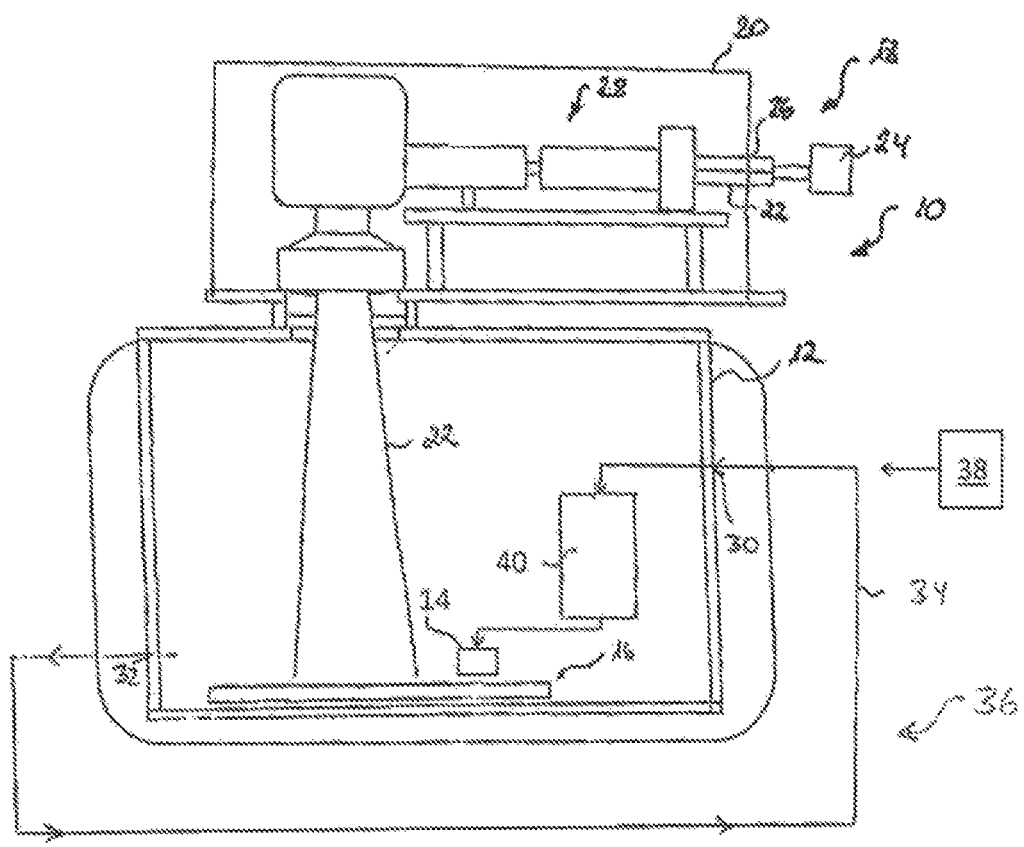

FIG. 1 shows a powder bed fusion apparatus 10 for manufacturing a component (work piece) by an additive layer construction method. The apparatus 10 comprises a process chamber 12. A powder application device 14, which is disposed in the process chamber 12, serves to apply a raw material powder onto a carrier 16. The process chamber 12 is sealable against the ambient atmosphere, i.e., against the environment surrounding the process chamber 12. The carrier 16 is designed to be displaceable in a vertical direction so that, with increasing construction height of a component, as it is built up in layers from the raw material powder on the carrier 16, the carrier 16 can be moved downwards in the vertical direction.

The apparatus 10 further comprises an irradiation device 18 for selectively irradiating laser radiation onto the raw material powder applied onto the carrier 16. By means of the irradiation device 18, the raw material powder applied onto the carrier 16 may be subjected to laser radiation in a site-selective manner in dependence on the desired geometry of the component that is to be produced. The irradiation device 18 has a hermetically sealable housing 20. A radiation beam 22, in particular a laser beam, provided by a radiation source 24, In particular a laser source which may, for example, comprise a diode pumped Ytterbium fiber laser emitting laser light at a wavelength of approximately 1070 to 1080 nm is directed into the housing 20 via an opening 26.

The irradiation device 18 further comprises an optical unit 28 for guiding and processing the radiation beam 22. The optical unit 28 may comprise a beam expander for expanding the radiation beam 22, a scanner and an object lens. Alternatively, the optical unit 28 may comprise a beam expander including a focusing optic and a scanner unit. By means of the scanner unit, the position of the focus of the radiation beam 22 both in the direction of the beam path and in a plane perpendicular to the beam path can be changed and adapted. The scanner unit may be designed in the form of a galvanometer scanner and the object lens may be an f-theta object lens.

During operation of the apparatus 10, a first layer of a component to be produced is generated on the carrier 16 by selectively irradiating the raw material powder layer applied onto the carrier 16 with the radiation beam 22. The radiation beam 22 is directed over the raw material powder layer applied onto the carrier 16 in accordance with CAD data of the component to be produced. After the first layer of the component to be produced is completed, the carrier 16 is lowered in a vertical direction allowing the application of a successive powder layer by means of the powder application device 14. Thereafter, the successive powder layer is irradiated by means of the irradiation device 18. Thus, layer by layer, the component is built up on the carrier 16.

The process chamber 12 is provided with a powder inlet 30 for supplying raw material powder to the process chamber 12 and further to the powder application device 14. Excess raw material powder is discharged from the process chamber 12 via a powder outlet 32. The powder outlet 32 of the process chamber 12 is connected to the powder inlet 30 of the process chamber 12 via a powder circulation line 34. Thus, excess raw material powder which is discharged from the process chamber 12 via the powder outlet 32 may be recirculated to the powder inlet 30 of the process chamber 12 and reused in the powder application device 14. The process chamber 12 and the powder circulation line 34 thus can be considered as components of a powder cycle of the apparatus 10 which in FIG. 1 is designated with the reference numeral 36.

Instead of the closed powder cycle. 36 shown in FIG. 1, a powder repository 38 may be used, which is initially filled with raw material powder (e.g., before the beginning of a building process) and from which the raw material powder is transferred to the powder application device 14. Alternatively, the powder repository 38 may be replaceable or refillable during the building process.

Further, as shown in FIG. 1, both the closed powder cycle 36 and the powder repository 38 may be present, wherein the powder repository 38 is used to initially introduce raw material powder into the powder cycle 36 and/or to re-fill the powder cycle 36 with new raw material powder, e.g., during a building process. Alternatively, a continuous stream of raw, material powder may be, provided (e.g., from the powder repository 38), wherein excess powder of the building process is not directly fed back into the powder cycle 36 but temporarily stored in a temporary powder storage (not shown).

The repository 38, if present, may be arranged outside the powder bed fusion apparatus 10 (e.g., as external repository 38) or within the apparatus 10. In the powder cycle 36, a powder treatment section may be provided, for cleaning and/or processing the raw material powder.

In the powder cycle 36, i.e., between the powder outlet 32 and the powder application device 14, a powder supply section 40 is arranged. As shown in FIG. 1, the powder supply section 40 is arranged shortly before the powder application device 14. In case the repository 38 is present (additionally or instead of the closed powder cycle 36) the powder supply section 40 is arranged between the repository 38 and the powder application device 14.

The powder supply section 40 may be a section of the powder circulation line 34, i.e., a section of a powder line, via which the raw material powder is transferred to the powder application device 14. In that case, the raw material powder flows through the powder supply section without being collected (i.e., temporarily stored) there. Alternatively, the powder supply section 40 may comprise a powder container for temporarily storing raw material powder, before it is transferred to the powder application device 14.

Figure 2:
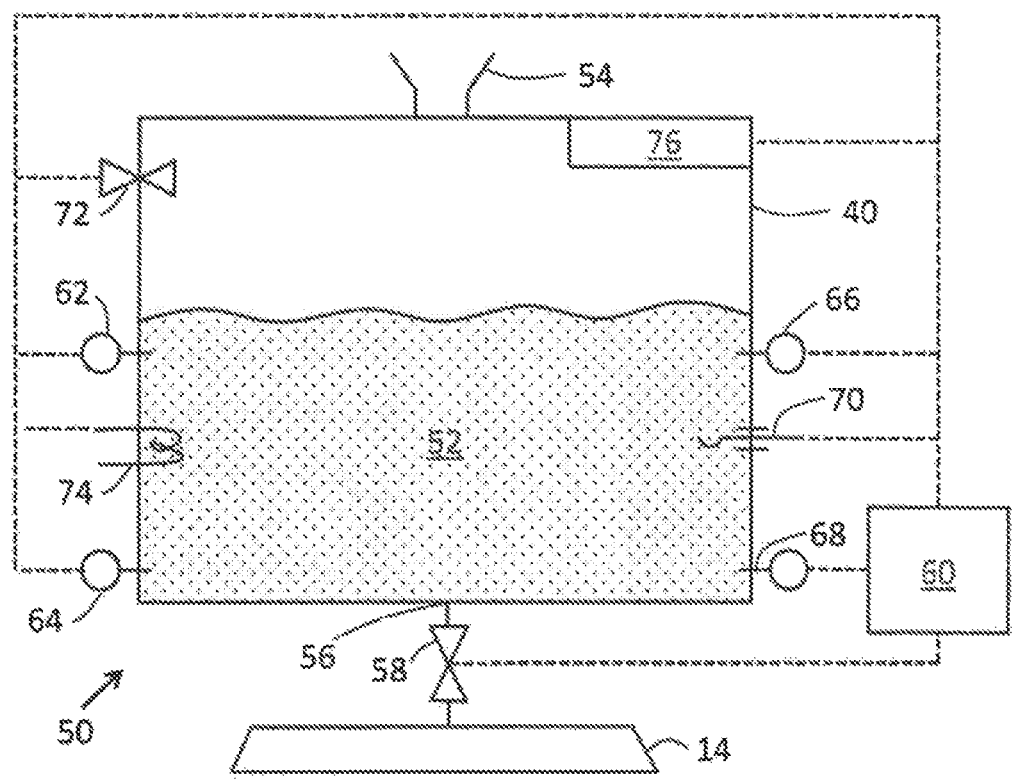
FIG. 2 shows a schematic representation of a powder delivery device according to a first embodiment of the present disclosure, wherein the powder supply section comprises a container for raw material powder.

FIG. 2 shows a schematic detailed view of a powder delivery device 50 comprising a powder supply section 40 according to an embodiment of the present disclosure. The powder supply section 40 may be used as the powder supply section 40 described above with reference to FIG. 1.

As shown in FIG. 2, the powder delivery device 50 comprises a powder supply section 40 configured to receive raw material powder 52 via a powder inlet 54. In the embodiment shown in FIG. 2, the powder supply section 40 comprises a container (i.e., a temporary storage) for raw material powder 52. The powder 52 either simply falls into the powder supply section 40 due to gravitational forces or it is conveyed into the powder supply section 40 by means of a pump, a screw conveyor, a fan, or the like. The powder delivery device 50 shown in FIG. 2 is configured to apply the powder 52 onto the carrier 16 from above.

The powder supply section 40 comprises an outlet 56 via which the powder 52 is provided to the powder application device 14. At the outlet 56, i.e., between the outlet 56 and the powder application device 14, a valve 58 is located. In an opened state of the valve 58, powder 52 can flow from the powder supply section 40 to the powder application device 14, whereas in a closed state of the valve 58, no powder 52 can flow from the powder supply section 40 to the powder application device 14. The valve 58 and, in particular, the opened and closed state of the valve is controlled by a control unit 60. The valve 58 is optional and can also be omitted in some embodiments.

As shown in FIG. 2, the powder delivery device 50 comprises five physical parameter determining units 62, 64, 66, 68, and 70. Each of the physical parameter determining units 62, 64, 66, 68, and 70 is configured to determine a physical parameter and to transmit a value of the physical parameter to the control unit 60. In the embodiment shown in FIG. 2, the physical parameter determining units 62, 64, 66, and 68 comprise sensors for measuring a physical property of the raw material powder 52 in the powder supply section 40 and/or for measuring a physical property of the direct environment of the raw material powder 52, such as a pressure within the powder supply section 40, an oxygen content within the powder supply section 40, and/or a humidity within the powder supply section 40. Additionally or alternatively, the physical parameter determining units 62, 64, 66, and 68 may comprise sensors for measuring a humidity and/or an oxygen content directly at the powder. The sensors of the physical parameter determining units 62, 64, 66, and 68 are configured to measure the respective physical property "on the flow", i.e. while powder 52 flows or is conveyed through the powder supply section 40. For example, each of the physical parameter determining units 62, 64, 66, and 68 may measure a respective physical parameter in constant time intervals and transmit the value of the physical parameter to the controller 60 in constant time intervals.

The physical parameter determining units 62, 64, 66, 68, and 70 of the powder delivery device 50 may be configured such that the physical parameters determined by the physical parameter determining unit 62, 64, 66, 68, and 70 are different from each other. In other words, the physical parameters relate to different physical properties (e.g., temperature, pressure humidity, oxygen content, flow properties, etc.).

However, the physical parameters determined by at least two of the physical parameter determining units 62, 64, 66, 68, and 70 may relate to the same physical property. For example, two of the physical parameter determining units 62, 64, 66, 68, and 70 can determine an oxygen content and transmit a corresponding value to the control unit 60. Since the physical parameter determining units 62, 64, 66, 68, and 70 are located at different positions of the powder supply section, the values for the determined physical parameters may be different from each other.

In addition or alternatively to the sensors described above, one or more of the physical parameter determining units may comprise a sampling point 70, as shown in FIG. 2. At the sampling point 70, a sample of the raw material powder 52 is taken from the powder supply section 40. The sample is then analyzed. Analyzing the sample may be performed either fully automated by means of an analyzing device, wherein at least one, physical parameter (such as powder particle size, powder porosity, powder purity, etc.) is determined and transmitted to the control unit 60. For example, the analysis may be performed optically, e.g., by means of a microscope. The analysis may also be performed by a human operator, wherein the operator determines at least one physical parameter (e.g. by using a microscope) and enters a value of the parameter into an input unit, from where it is transmitted to the control unit 60.

In the exemplary embodiment shown in FIG. 2, the powder delivery device 50 comprises physical parameter determining units 62, 64, 66, 68, and 70. These physical parameter determining units comprise a first humidity sensor 62 and a second humidity sensor 68, wherein both of the humidity sensors 62 and 68 are configured to determine a humidity value (e.g., an $H_2O$ content value) of the powder 52 within the powder supply section 40. As shown in FIG. 2, the first humidity sensor 62 is positioned upstream from the second humidity sensor 68 with regard to a flow direction and/or a conveying direction of the powder 52.

The physical parameter determining units of the embodiment shown in FIG. 2 further comprise a first oxygen sensor 66 and a second oxygen sensor 64, wherein both of the oxygen sensors 66 and 64 are configured to determine an oxygen content of the powder 52 within the powder supply section 40. As shown in FIG. 2, the first oxygen sensor 66 is positioned upstream from the second oxygen sensor 64 with regard to a flow direction and/or a conveying direction of the powder 52. The physical parameter determining units 62, 64, 66, 68, and 70 of the powder delivery device 50 are configured to measure the corresponding physical parameters (humidity value and oxygen content) "on the flow", i.e., while the powder 52 flows or is conveyed. E.g., these physical parameters may be measured while the powder falls down in front of an optical sensor of the respective physical parameter determining unit 62, 64, 66, 68, and 70.

The powder delivery device 50 of the embodiment shown in FIG. 2 further comprises a sampling point 70 for taking a sample of the raw material powder 52. From the sample, different physical parameters of the raw material powder 52 can be determined, such as a corrosion state, an oxidation state, a powder particle size, a powder particle form, a powder particle distribution, a powder purity, a powder particle porosity, and/or a powder particle density.

The powder delivery device 50 of the embodiment shown in FIG. 2 further comprises three powder treatment units 72, 74, and 76. In particular, these powder treatment units comprise a gas introduction unit 72, a heating unit 74, and a drying unit 76. Each of the powder treatment units 72, 74, and 76 is connected to the control unit 60 and can be activated and deactivated by control of the control unit 60.

The gas introduction unit 72 is configured to introduce gas into the powder supply section 40, when activated. The gas may be, for example, an inert gas, such as argon. The gas introduction unit 72 may comprise a valve controlled by the control unit 60. When the gas introduction unit 72 is activated by the control unit 60, the gas can flow into the powder supply section 40. By introducing gas into the powder supply section 40, the powder 52 in the powder supply section 40 can be loosened and/or dried. Thereby, an oxygen content and/or a water content of the powder 52 can be controlled. Further, by introducing gas into the powder supply section 40, flow properties (such as flowability) of the powder 52 can be controlled.

The heating unit 74 is configured to apply heat to the powder 52 in the powder supply section 40. By heating the powder 52, for example a water content (humidity) of the powder 52 can be controlled. In other words, by activating the heating unit 74, the powder 52 in the powder supply section 40 can be dried.

The drying unit 76 comprises a drying agent. By activating the drying unit 76, the drying agent may be brought into contact with the powder 52 and/or the drying agent may be brought into contact with a direct environment of the powder 52 in order to absorb humidity from the powder 52.

In the following, an operation of the powder delivery device 50 shown in FIG. 2 will be described. The operation is controlled by the control unit 60. The control unit 60 may be part of a central control unit of the apparatus 10. The control unit 60 comprises a processor and a memory, wherein instructions are stored in the memory which, when carried out, instruct the processor to perform the operation described below.

During a building process of a work piece, performed by the apparatus 10, powder 52 is provided from the powder supply section 40 to the powder application device 14. The powder 52 is then applied to the carrier 16 by the powder application device 14. While the powder 52 is transferred through the powder supply section 40 (in the embodiment of FIG. 2 from top to bottom), the first oxygen sensor 66 measures an oxygen content of the powder 52 and provides this oxygen content to the control unit 60. The control unit 60 determines whether the measured oxygen content meets a particular tolerance criterion. For example, the tolerance criterion may define that the oxygen content is above a particular threshold or not, below a particular threshold or not, or within a particular range of values or not. Just as an example, the tolerance criterion may define that the oxygen content is within the range of 50 to 20.000 ppm.

In case this tolerance criterion is not met by the measured oxygen content (e.g., the measured value is out of a predefined tolerance range), the control unit 60 instructs one or more of the powder treatment units 72, 74, and 76 to perform a powder treatment. In one example, in case the oxygen content is determined to be out of a predefined range, the control unit 60 instructs the gas introduction unit 72 to introduce argon into the powder supply section 40. Alternatively, in that case, the control unit 60 may instructs one of the other powder treatment units 74 and/or 76 to perform a respective powder treatment.

Instead or additionally to the oxygen content, another physical property may be measured, such as a humidity ($H_2O$ content) of the powder. For this, the first humidity sensor 62 is used. In case the humidity of the powder 52 does not meet a predefined tolerance criterion, the control unit 60 initiates a powder treatment performed by one of the powder treatment units 72, 74, and/or 76. For example, in case a humidity value of the powder 52 is too high, the control unit 60 may activate the heating unit 74 in order to dry the powder 52 and in order to reduce the humidity value. Just as an example, the tolerance criterion may define that the humidity is within the range of 5% to 10% relative humidity.

Similar to the examples described above, other physical parameter determining units may be used in order to measure other physical parameters of the powder and/or the direct environment of the powder in the powder supply section 40.

As an example, one or more physical properties of the powder 52 may be determined by using the sampling point 70 as described above.

As another example, a physical parameter determining unit for determining a pressure within the powder supply section 40 and/or for determining a pressure difference between the powder supply section 40 and a process chamber of the apparatus 10 may be provided. Additionally or alternatively, a physical parameter determining unit for determining a pressure difference between the powder supply section 40 and an outside environment of the apparatus 10 may be provided. Depending on the measured pressure and/or pressure difference, respective powder treatments can be initiated.

In addition to the operation described above, a second physical parameter may be determined, wherein the second physical parameter relates to the same physical property as a first physical parameter which is also recorded. The first physical parameter and the second physical parameter may be determined at different times (e.g., with a predefined interval between determining the first physical parameter and the second physical parameter) by the same physical parameter determining unit. Additionally or alternatively, the first physical parameter and the second physical parameter may be determined at different locations of the powder supply section 40 by using a first physical parameter determining unit and a second physical parameter determining unit.

The measurements described above may be performed continuously. In case at least a first physical parameter determining unit and a second physical parameter determining unit are provided, it may be advantageous to determine the time a powder particle needs to travel from the first to the second physical parameter determining unit. This time may be variable. It may depend, e.g., on the flow rate in the powder supply section 40. Hence, it may depend, e.g., on the used apparatus 10 and/or on a powder supply rate.

In case the second physical parameter does not meet a second tolerance criterion, the control unit 60 closes the valve 58. Additionally or alternatively, the control unit 60 instructs the apparatus 10 to terminate a building process of a work piece. The second tolerance criterion may correspond to the first tolerance criterion or may define different threshold values and/or range boundaries than the first tolerance criterion. For example, a tolerance range of the second tolerance criterion may be smaller than a tolerance range of the first tolerance criterion and may lie entirely within the tolerance range of the first tolerance criterion.

Further, the building process does not need to be permanently terminated in case the second physical parameter does not meet the second tolerance criterion. For example, in case the second physical parameter does not meet a second tolerance criterion, the building process may be temporarily paused and started again once the second physical parameter does meet the second tolerance criterion again (e.g., is within a predetermined range).

As an alternative to closing the valve and/or terminating the building process, the building process may continue even when the second physical parameter does not meet the second tolerance criterion. For example, in case the second physical parameter does not meet the second tolerance criterion but does meet a third tolerance criterion, a further powder treatment may be initiated by a further powder treatment section or a degree of powder treatment performed by a powder treatment section may be increased (i.e., increasing an amount of introduced inert gas, increasing an amount of heating power of a heating unit, switching on a further heating unit/further heating units, etc.). The third tolerance criterion may define a wider value range of physical parameters than the second tolerance criterion. In case the second physical parameter does not meet the third tolerance criterion, the process may be terminated.

As an example, according to an embodiment, the operation described above will now be explained in detail with regard to the first humidity sensor 62, the second humidity sensor 68, and the heating unit 74. Firstly, the first humidity sensor 62 measures a first humidity value and transmits this value to the control unit 60. In case the control unit 60 determines that the measured first humidity value does not meet a predefined first tolerance criterion, it activates the heating unit 74 in order to heat and to dry the powder 52 in the powder supply section 40. After a predefined time of heating by the heating unit 74, the second humidity sensor 68 measures a second humidity value and transmits this value to the control unit 60. In case the control unit 60 determines that the measured second humidity value does not meet a predefined second tolerance criterion (which may correspond to the first tolerance criterion), it closes the valve 58 and terminates a building process.

Thereby, the powder delivery device 50 according to the present disclosure can determine whether the powder 52 in the powder supply section 40 fulfills a predefined quality criterion (first tolerance criterion). If that is not the case, the powder delivery device 50 has the opportunity to initiate countermeasures by performing a powder treatment by means of a powder treatment unit before the powder 52 finally leaves the outlet 56 of the powder supply section 40. However, it may happen that the powder treatment is not successful or not entirely successful and that even the powder shortly before leaving the powder supply section 40 still does not meet a second predefined quality criterion (second tolerance criterion). In that case, in order to maintain a high quality standard of the produced work piece, the valve 58 can be closed and the building process can be terminated.

Instead of determining a first physical parameter and a second physical parameter by means of difference physical parameter determining units, one and the same physical parameter determining unit may be used for determining the first physical parameter and the second physical parameter before and after performing the powder treatment, respectively.

Figure 3:
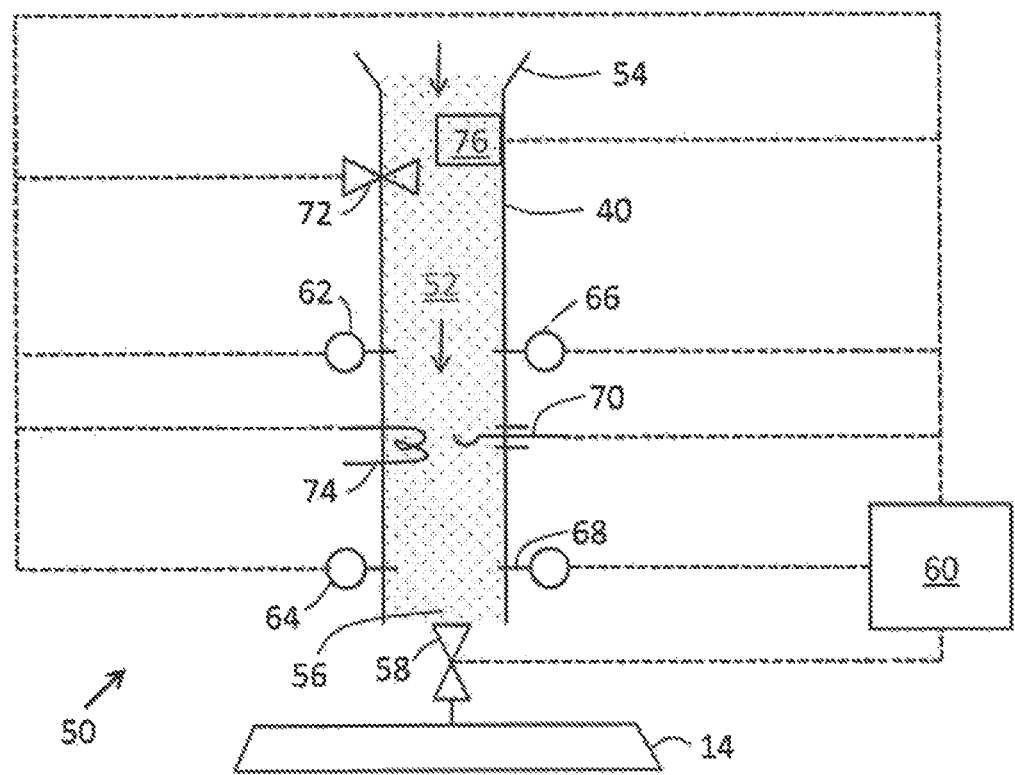
FIG. 3 shows a schematic representation of a powder delivery device according to a second embodiment of the present disclosure, wherein the powder supply section is a section of a powder line.

FIG. 3 shows a schematic detailed view of a powder delivery device 50 comprising a powder supply section 40 according to a second, embodiment of the present disclosure. The powder supply section 40 may be used as the powder supply section 40 described above with reference to FIG. 1. The main difference between the powder supply section 40 of the first embodiment and the powder supply section 40 of the second embodiment is that the powder supply section 40 of the second embodiment shown in FIG. 3 does not comprise a container (i.e., a temporary storage) for raw material powder 52. The powder supply section 40 shown in FIG. 3 is rather a section of a powder line (e.g., part of a pipe or a tube). The description of FIG. 2 above also applies to the embodiment shown in FIG. 3, where applicable.

Figure 4:
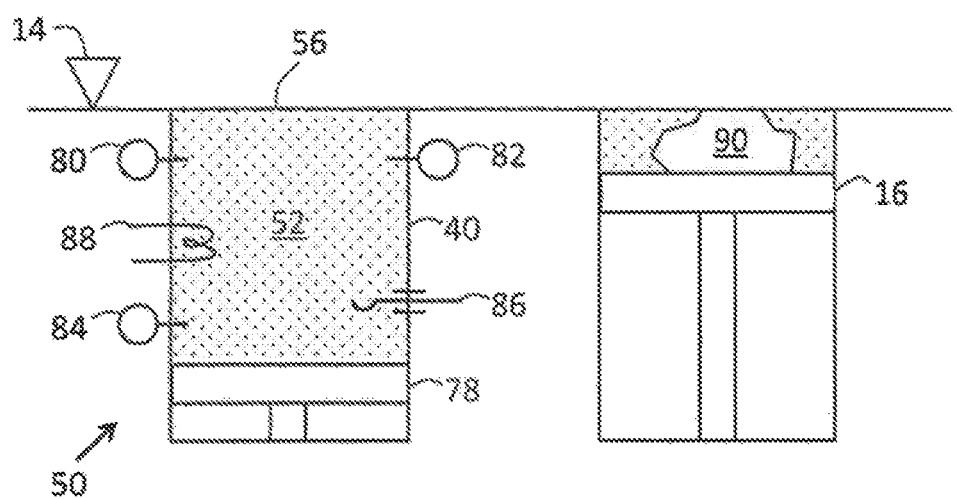
FIG. 4 shows a schematic representation of a powder delivery device according to a third embodiment of the present disclosure.

FIG. 4 shows a third embodiment of a powder delivery device 50 according to the present disclosure. A main difference between the powder delivery device 50 shown in FIG. 4 and the powder delivery device 50 shown in FIG. 2 is that in the embodiment of FIG. 4, powder 52 is delivered from bottom to top by means of a powder delivery piston 78. The powder 52 leaves the powder supply section 40 via an outlet 56. From the outlet 56, the powder 52 is transferred to a carrier 16 by means of a powder application device 14. On the carrier 16, a work piece 90 is produced by means of an additive layering process.

Further, the powder delivery device 50 of the embodiment shown in FIG. 4 comprises at least one first physical parameter determining unit and at least one powder treatment unit. Only as an example, four physical parameter determining units 80, 82, 84, and 86 are arranged at the powder supply section 40 of the powder delivery device 50 shown in FIG. 4. Further, only as an example, one powder treatment unit 88 is arranged at the powder supply section 40 of the powder delivery device 50 shown in FIG. 4. However, the arrangement of the physical parameter determining unit(s) and the arrangements of the powder treatment unit(s) may be similar or identical to that discussed above with regard to FIG. 2. Further, an operation of the powder delivery device 50 shown in FIG. 4 may be similar or identical to that discussed above with regard to FIG. 2.

Regarding the operation of the device shown in FIG. 4, instead of a valve being closed (as described with regard to the valve 58 shown in FIG. 2), the control unit (not shown) of the powder delivery device 50 shown in FIG. 4 may simply instruct the powder delivery piston 78 to stop powder delivery upwards.

In any of the embodiments described herein, the powder supply section 40 may optionally be designed as a two-piece component and/or may comprise two subsequent sections (a first section and a second section provided downstream from the first section). In that case, treated powder and untreated powder can be kept separated from each other. This may make sense, e.g., after mixing with gas for drying and/or for loosening of the powder. For example, in the first section, a measurement by a first physical parameter determining unit and a corresponding powder treatment by a powder treatment unit is carried out. In the second section, a control measurement by a second physical parameter determining unit is carried out.

In any of the embodiments described herein, a temporary powder storage may be provided between the powder supply section 40 and the powder application device 14. In that case, "good powder" (i.e., powder meeting certain quality requirements) may be stored in the temporary powder storage and powder may be taken from there for application by the powder application device 14 while powder is treated in the powder supply section 40.

By applying the technique described herein, it is possible to monitor and control physical properties of the raw material powder 52, which may influence the quality of a work piece produced with the powder 52. Since these properties can be controlled directly before the powder 52 is applied onto the carrier 16, the powder properties do not substantially change before the powder is solidified, e.g. by a laser. The technique described herein is convenient since an operator of the apparatus 10 does not need to know detailed process parameters and/or tolerance criterions for the physical parameters. According to the present disclosure, these parameters are automatically monitored and adjusted by the powder delivery device 50. Therefore, the process safety can be improved.

The invention claimed is:

1. A powder bed fusion apparatus comprising:
a powder application device; and
a powder delivery device for providing raw material powder to the powder application device, the powder delivery device comprising:
a powder supply section configured to receive raw material powder, the powder supply section comprising an outlet for providing the raw material powder to the powder application device;
a first physical parameter determining unit arranged at a first location of the powder supply section and configured to determine a first physical parameter in the powder supply section;
a second physical parameter determining unit arranged at a second position of the powder supply section and configured to determine a second physical parameter in the powder supply section;
a controller configured to determine whether the first physical parameter meets a first tolerance criterion and to determine whether the second physical parameter meets a second tolerance criterion;
a powder treatment unit, wherein the controller is configured to instruct the powder treatment unit to perform a powder treatment in case it determines that the first physical parameter does not meet the first tolerance criterion; and
wherein the controller is configured to, in case it determines that the second physical parameter does not meet the second tolerance criterion, stop a powder application process of the powder application device, or
wherein the powder bed fusion apparatus further comprises a valve located at the outlet of the powder supply section and the controller is configured to, in case it determines that the second physical parameter does not meet the second tolerance criterion, close the valve.

2. The powder bed fusion apparatus of claim 1, wherein the second physical parameter relates to the same physical property as the first physical parameter.

3. The powder bed fusion apparatus of claim 1, wherein the second position of the second physical parameter determining unit is located downstream of the first position of the first physical parameter determining unit.

4. The powder bed fusion apparatus of claim 1, wherein the controller is configured to instruct the powder treatment unit to perform a powder treatment in case it determines that the second physical parameter does not meet the second tolerance criterion.

5. The powder bed fusion apparatus of claim 1, wherein the first physical parameter determining unit comprises at least one of an oxygen measurement unit, a humidity measurement unit, a flow property measurement unit, a corrosion state measurement unit, an oxidation state measurement unit, a pressure measurement unit, a powder particle size measurement unit, a powder particle form measurement unit, a powder particle distribution measurement unit, a powder purity measurement unit, a powder particle porosity measurement unit, a powder particle density measurement unit, and a pack density measurement unit.

6. The powder bed fusion apparatus of claim 1, wherein the first physical parameter determining unit comprises at least one of a sampling point and a sensor.

7. The powder bed fusion apparatus of claim 1, wherein the powder treatment unit comprises at least one of a gas introduction unit, a powder loosening unit, a heating unit, a drying unit, and a vacuum generation unit.

8. A powder delivery method for providing raw material powder to a powder application device of a powder bed fusion apparatus, the powder delivery method comprising:
providing raw material powder to the powder application device, from an outlet of a powder supply section;
determining a first physical parameter in the powder supply section at a first location of the supply section;
determining a second physical parameter in the powder supply section at a second location of the powder supply section;
determining whether the first physical parameter meets a first tolerance criterion;
determining whether the second physical parameter meets a second tolerance criterion;
performing a powder treatment in case it is determined that the first physical parameter does not meet the first tolerance criterion; and
in case it is determined that the second physical parameter does not meet the second tolerance criterion, stopping a powder application process of the powder application device and/or closing a valve located at the outlet of the powder supply section.

9. The powder delivery method of claim 8, wherein the second physical parameter relates to the same physical property as the first physical parameter.

* * * * *